United States Patent
Osipov et al.

(10) Patent No.: US 11,127,863 B2
(45) Date of Patent: Sep. 21, 2021

(54) GATE STRUCTURE AND METHOD FOR PRODUCING SAME

(71) Applicant: FORSCHUNGSVERBUND BERLIN E.V., Berlin (DE)

(72) Inventors: Konstantin Osipov, Berlin (DE); Richard Lossy, Berlin (DE); Hans-Joachim Würfl, Zeuthen (DE)

(73) Assignee: FORSCHUNGSVERBUND BERLIN E.V., Berlin (DE)

( * ) Notice: Subject to any disclaimer, the term of this patent is extended or adjusted under 35 U.S.C. 154(b) by 0 days.

(21) Appl. No.: 16/462,650

(22) PCT Filed: Nov. 20, 2017

(86) PCT No.: PCT/EP2017/079707
§ 371 (c)(1),
(2) Date: May 21, 2019

(87) PCT Pub. No.: WO2018/091699
PCT Pub. Date: May 24, 2018

(65) Prior Publication Data
US 2020/0066919 A1 Feb. 27, 2020

(30) Foreign Application Priority Data
Nov. 21, 2016 (DE) .......................... 102016122399.9

(51) Int. Cl.
*H01L 29/812* (2006.01)
*H01L 29/66* (2006.01)

(52) U.S. Cl.
CPC .... *H01L 29/8128* (2013.01); *H01L 29/66446* (2013.01)

(58) Field of Classification Search
None
See application file for complete search history.

(56) References Cited

U.S. PATENT DOCUMENTS

| | | | |
|---|---|---|---|
| 5,053,348 A | 10/1991 | Mishra et al. | |
| 5,925,902 A * | 7/1999 | Sakura | H01L 21/28581 |
| | | | 257/280 |

(Continued)

FOREIGN PATENT DOCUMENTS

| | | |
|---|---|---|
| JP | H10335351 A | 12/1998 |
| JP | 2011233805 A | 11/2011 |
| JP | 2014183125 A | 9/2014 |

OTHER PUBLICATIONS

Yoon Hyung Sup et al: "Microwave 2.7 Low-Noise Performance of 0.17 mu Gate-Length AlGaN/GaN HEMTs on SiC With Wide Head Double-Deck T-Shaped Gate", IEEE Electron Device Letters. IEEE Service Center. New York. NY. US Bd. 37. Nr. 11; Oct. 21, 2016 (Oct. 21, 2016). pp. 1407-1410.

(Continued)

*Primary Examiner* — Long Pham
(74) *Attorney, Agent, or Firm* — Ray Quinney & Nebeker P.C.; Paul N. Taylor

(57) ABSTRACT

This invention concerns a gate structure and a process for its manufacturing. In particular, the present invention concerns the gate structuring of a field effect transistor with reduced thermo-mechanical stress and increased reliability (lower electromigration or diffusion of the gate metal). The gate structure according to the invention comprises a substrate; an active layer disposed on the substrate; an intermediate layer disposed on the active layer, the intermediate layer having a recess extending through the entire intermediate layer towards the active layer; and a contact element which is arranged within the recess, the contact element completely filling the recess and extending to above the intermediate layer, the contact element resting at least in sections directly on the intermediate layer; the contact element being made of (Continued)

a Schottky metal and the contact element having an interior cavity completely enclosed by the Schottky metal.

8 Claims, 3 Drawing Sheets

(56) References Cited

U.S. PATENT DOCUMENTS

| | | |
|---|---|---|
| 7,476,600 B1 | 1/2009 | Atanackovic |
| 2002/0048858 A1 | 4/2002 | Furukawa et al. |
| 2013/0105817 A1 | 5/2013 | Saunier |
| 2015/0132932 A1 | 5/2015 | Green et al. |
| 2015/0221758 A1 | 8/2015 | Miura et al. |
| 2020/0066919 A1* | 2/2020 | Osipov ............. H01L 21/28587 |

OTHER PUBLICATIONS

Lossy Richard et al: "Reliability studies on GaN HEMTs with sputtered Iridium gate module"; Microelectronics and Reliability; Bd. 52. Nr. 9; Aug. 11, 2012 (Aug. 11, 2012). pp. 2144-2148.
International Search Report for PCT/EP2017/079707, dated Jan. 30, 2018, 6 pages.

* cited by examiner

GATE STRUCTURE AND METHOD FOR PRODUCING SAME

CROSS REFERENCE TO RELATED APPLICATIONS

This application is a U.S. Nationalization of PCT Application Number PCT/EP2017/079707, filed on Nov. 20, 2017, which claims priority to German Patent Application No. 10 2016 122 399.9, filed on Nov. 21, 2016, the entireties of which are incorporated herein by reference.

DESCRIPTION

The present invention concerns a gate structure and a method for manufacturing the same. In particular, the present invention concerns a gate structuring of a field-effect transistor with reduced thereto-mechanical stress and increased reliability (lower electromigration or diffusion of the gate metal).

STATE OF THE ART

The term "gate" is used in particular for field effect transistors (FET) to describe the connection used to control the FET. Other connections are Source and Drain. By varying the voltage applied to the gate, the current flow between drain and source can be controlled. The individual connections enable electrical contacting of the switching element and as electrodes lead the supplied voltages and currents into the active switching range. Therefore, the gate connection is also referred to as the control electrode or control connection. The structural composition of the gate connection and its embedding in the associated switching element is referred to as the gate structure.

U.S. Pat. No. 7,476,600 B1 describes a gate structure for a FET and a corresponding manufacturing process. In this case, a mesa-shaped stack of layers grown epitaxially from crystalline silicon on a surface with an electrical metal contact applied to the stack is involved.

A T-shaped gate structure, a so-called T-gate, is known from US 2002/0048858 A1. The T-gate is the conductive gate region of a semiconductor device (e.g. metal semiconductor field effect transistor (MeSFET), high electron mobility transistor (HEMT), etc.) whose upper region is wider than the region at the base (i.e. near the active region of the semiconductor device). The advantage of such an arrangement is that an extremely short channel length can be realized over the narrow area of the gate in the semiconductor component, whereby high operating frequencies and a high transconductance are achieved, while a high conductivity of the T-gate enables high switching speeds over the wider upper gate area.

In U.S. Pat. No. 5,053,348 A a process for producing a self-aligning T-Gate HEMT is disclosed. US 2013/0105817 A1 also reveals a HEMT with a T-gate structure. A transistor with a modified T-gate in the form of a passivated gate structure and a corresponding manufacturing process are presented in U.S. Pat. No. 7,608,497 B1.

The transistors mentioned are so-called short gate transistors. With such transistor types, the length of the gate area is kept as short as possible, whereby the upper area of a gate contact is designed as a metallic conductor with high electrical conductivity. The active area of the switching element is generally composed of different semiconductor materials.

In these highly heterogeneous material systems, the different substances influence each other and can therefore interact with each other.

In particular, two problems arise in the state of the art which negatively influence the reliability and electrical performance of the switching elements. The first problem is a migration (or field-driven diffusion) of the highly conductive parts of the metallization (e.g. Au) of the gate contact (or the metallic parts of a gate layer system) towards the surface of the semiconductor materials of the active region of the switching element (hereinafter also referred to as the active zone or active layer). This leads via various chemical reactions in particular to pit formation, which leads to errors during the operation of the transistor and to reduced reliability (e.g. shorter lifetime). The second problem concerns the thermal stability of the metallization of the gate terminal in conjunction with the surrounding materials, in particular a surrounding passivation or the adjacent semiconductor materials. The highly complex structure of a modern FET, in which a wide variety of materials are combined in a very small space, leads to a lack of adaptation of the thermal expansion coefficients of the respective materials, so that during operation of the switching element a high thereto-mechanical load can occur in the area of the gate. Since these locally occurring mechanical stresses within the switching element can only be insufficiently compensated or relaxed by the switching element, this effect can lead in particular to the occurrence of defects at the boundary layers and in the materials mentioned and thus to unwanted leakage currents and premature failure of the switching element.

DISCLOSURE OF THE INVENTION

It is therefore a task of the present invention to indicate an alternative gate structure which overcomes the described disadvantages of the prior art. In particular, a gate structure of a field effect transistor (FET) with reduced thermo-mechanical stress and increased reliability (lower electromigration or diffusion of the gate metal) is to be specified. Thus, a FET and a process for producing such a FET are disclosed, wherein the inventive FET and the process for producing such a FET have a gate structure corresponding to the present invention.

These tasks are solved according to the invention by the features of patent claim 1 as well as patent claim 8. Appropriate forms of the invention are contained in the dependent claims.

The gate structure according to the invention comprises a substrate; an active layer disposed on the substrate; an intermediate layer disposed on the active layer, wherein the intermediate layer have a recess extending through the entire intermediate layer towards the active layer; and a contact element arranged inside the recess, wherein the contact element completely fills the recess and extends to above the intermediate layer, wherein the contact element rests at least in sections directly on the intermediate layer; wherein the contact element is made of a Schottky metal and the contact element has an interior cavity completely enclosed by the Schottky metal.

Preferably the substrate consists of SIC. Substrates made of Si, sapphire, GaAs, InP and GaN are also preferred.

The main electrical switching and conduction processes take place in the active layer. The active layer can have a large number of differently structured areas or zones made of different semiconductor materials with variable doping. Preferably the active layer can include AlGaN/GaN as semiconductor material. Other preferred material composites are AlN/GaN, InAlN/GaN, Si, AlGaAs/InAlAs, GaAs and SiC. In binary composites, the respective material content can be between 0% and 100%.

In particular, an intermediate layer is a passive layer which is arranged between the active layer and the contact element. Passive means here that this layer has little or no influence on the charge transport within the switching element. A typical example of an intermediate layer is a dielectric passivation layer, preferably made of SiNx. Such a passivation layer also preferably includes SiOx, SiNxOy, Al2O3, ZnO, fluorosilicate glass (FSG), benzocyclobutene BOB or polyimides (PI). The intermediate layer can also be a spacer layer. The preferred thickness of the intermediate layer is between 50 nm and 1000 nm.

According to the invention a recess is arranged within the intermediate layer which extends through the entire intermediate layer in the direction of the active layer. This recess is a gate trench that allows electrical access to the active zone through the intermediate layer. A contact element is arranged in this opening within the intermediate layer.

The contact element completely fills the recess and extends to above the intermediate layer, wherein the contact element lies directly on the intermediate layer, at least in sections. Preferably, the gate structure according to the invention is a T-gate, wherein the part of the contact element resting at least in sections on the intermediate layer represents the horizontal line of the T-shaped area. In general, T-shaped structures are interpreted very broadly; in particular, such structures are often referred to as mushroom-shaped, arrow-shaped or rivet-shaped. Any other conformations of the contact element within the framework of this disclosure are also possible. Completely filled means that the Schottky metal may also cover the entire surface of the recess in combination with the metals above it, i.e. so that there are no cavities between these areas and the Schottky metal.

The contact element is made of a Schottky metal. Preferably this is Ir. Pt, Ni, Al, Os, TiW and WSi are also preferred. In contrast to the prior art, the contact element made of a Schottky metal fills the recess completely (conformably) and therefore also ensures a homogeneous and cavity-free coating on the side walls. The Schottky metal can also act as an interface, preventing diffusion effects between an electrically conductive material such as Au, Cu, Al or Ag and the semiconductor, Schottky metals are mostly used in conventional gate structures for the so-called Schottky contact layer. In contrast, the entire contact element is made of a "thick" Schottky metal in accordance with the invention.

According to the invention, the contact element has a cavity completely enclosed by the Schottky metal in its interior. This does not contradict the complete filling of the recess in the intermediate layer, as this is understood to mean the complete covering of the surface of the recess with the Schottky metal. In particular, the cavity inside the contact element may contain vacuum, air or any inert gas. The cavity is preferably located centrally within the width of the recess. Preferably the cavity has an oval shape. Preferably the cavity extends to above the intermediate layer. The volume of the cavity is preferably at least 10% of the volume of the recess, preferably at least 20%, preferably at least 50%, preferably at least 75%, and even more preferably at least 95%.

Preferably the intermediate layer has a thickness between 50 nm and 1000 nm. Preferably, the recess at the boundary to the underlying layer has a width between 10 nm and 300 nm. Preferred are corresponding recess widths between 10 nm and 250 nm, preferred between 10 nm and 200 nm, preferred between 10 nm and 150 nm, preferred between 10 nm and 100 nm, and even more preferred between 10 nm and 50 nm, as the advantages according to the invention, in particular targeted voltage relief, become increasingly important with smaller recess widths. However, the advantages are also apparent for larger recess widths, in particular for recess widths below 500 nm, preferably below 400 nm, and even more preferably below 350 nm. The ratio between the two parameters mentioned (thickness to width ratio) is preferably between 1.5:1 and 2.5:1, more preferably between 1.75:1 and 2.25:1 and even more preferably between 1.9:1 and 2.1:1. For example, the intermediate layer may have a thickness between 275 nm and 325 nm and the recess at the boundary with the underlying layer may have a width between 125 nm and 175 nm. A corresponding contact element fills the recess completely and preferably extends between 275 nm and 325 nm above the intermediate layer.

The idea of the present invention is that the use of a thick Schottky metal in direct inner contact with both the narrow wall of the recess and the semiconductor material, it is possible to produce an amorphous or at least nanocrystalline contact element which, as a gate contact, has the following advantages over the state of the art:
1) The recess can be metallized in such a way that the Schottky metal completely covers the entire surface of the semiconductors or an additional passivation applied to the semiconductors, i.e. there are no cavities between these areas and the Schottky metal.
2) The Schottky metal contact element provides a diffusion barrier between additional gate metals with increased conductivity applied to the contact element and the semiconductor surfaces beneath the contact element. In particular, this effectively prevents the migration or diffusion of gold from an additional gold coating of the contact element into the channel area, i.e. into the active layer.
3) The cavity within the contact element, which is formed according to the invention, represents a relaxation area for mechanical stress occurring within the material compound. In this way, mechanical deformations occurring due to high-temperature processing, for example, can be absorbed. In particular, the cavity can effectively compensate a thereto-mechanical load occurring during operation of the switching element, so that its negative effects can be prevented or at least significantly reduced. In particular, this suppresses the formation of mechanical defects in the gate area.

In a first embodiment of a gate structure according to the invention, the contact element and the active layer are in direct contact with each other. The Schottky metal of the contact element thus borders directly on the active semiconductor material (e.g. the channel area of the transistor formed therein). In particular, there are no cavities between the active layer and the Schottky metal. The first embodiment can be the gate structure of a HEMT or MeSFET, for example.

In a second embodiment of a gate structure according to the invention, the contact element is separated from the active layer and the intermediate layer by a dielectric cladding. The term cladding is used here to describe a thin film which is relatively thinner than the thickness of the contact element and surrounds the contact element on several sides (layer thickness preferably between 1 nm and 50 nm). Preferably the cladding is made with a dielectric material (gate dielectric) like Al2O3. Also preferred are SiOx, SiNxOy, ZrO2, TiO2, Ta2O5, BST/BSTO, STO, and PZT.

The second embodiment may, for example, be a first variant of a gate structure of a metal oxide semiconductor field effect transistor (MOSFET).

A third embodiment of a gate structure according to the invention may further include a dielectric layer disposed directly between the active layer and the intermediate layer, the contact element directly contacting the dielectric layer. The Schottky metal of the contact element is thus directly adjacent to the dielectric layer. In particular, there are no cavities between the dielectric layer and the Schottky metal. Preferably the dielectric layer has a thickness between 1 nm and 50 nm. Preferably, the dielectric layer comprises Al2O3. Also preferred are SiOx, SiNxOy, ZrO2, TiO2, Ta2O5, BST/BSTO, STO, and PZT. The third embodiment may be a second variant of a gate structure of a metal oxide semiconductor field effect transistor (MOSFET).

Preferably the intermediate layer comprises at least a first intermediate layer and a second intermediate layer. An intermediate layer can also be an intermediate layer stack.

A fourth embodiment of a gate structure according to the invention may be the gate structure of a vertical FET. For example, the substrate may be an n+-GaN substrate, the active layer an n--GaN drift layer, the first intermediate layer a p-type GaN layer and the second intermediate layer an n+-GaN layer. A corresponding contact element may be in direct contact with the active layer according to one of the three aforementioned exemplary embodiments, separated from the active layer and the intermediate layer by a dielectric cladding, or separated from the active layer by a dielectric layer disposed directly between the active layer and the intermediate layer, wherein the contact element contacts the dielectric layer directly.

Preferably, the contact element above the intermediate layer is directly covered by a gate metal. It is also preferred that the contact element with a gate metal above the intermediate layer is completely surrounded by a dielectric covering layer. The gate metal may preferably be Au. Also preferred are Cu, Al, Ag and alloys of these metals. The dielectric covering layer may preferably be SiNx. Also preferred are SiOx, SiNxOy, Al2O3, ZnO, fluorosilicate glass (FSG) and polyimides (PI). The thickness of the dielectric covering layer is preferably between 0 nm and 1000 nm.

The method according to the invention for producing a gate structure comprises providing a substrate having an active layer disposed on the substrate and an intermediate layer disposed on the active layer; creating a recess in the intermediate layer, wherein the recess extends through the entire intermediate layer towards the active layer; filling and covering the recess by depositing a Schottky metal by means of sputtering, wherein the covering is continued at least until the Schottky metal above the recess completely covers the recess; structuring a contact element of the deposited Schottky metal, wherein the contact element rests at least in sections directly on the intermediate layer.

Preferably the intermediate layer has a thickness between 50 nm and 1000 nm.

A recess in the intermediate layer can be created by applying a coating (resist) suitable for electron beam lithography or optical lithography to the intermediate layer and using a corresponding lithography step in the resist layer to create an etching mask to form the recess in the intermediate layer. Preferred coating materials include ZEP 520A, PMMA, PMGI, copolymers and LOR.

The recess in the intermediate layer can then be created by a structuring process suitable for the intermediate layer. Preferably, the recess at the boundary to the underlying layer has a width between 10 nm and 300 nm. Preferred are corresponding recess widths between 10 nm and 250 nm, preferred between 10 nm and 200 nm, preferred between 10 nm and 150 nm, preferred between 10 nm and 100 nm, and even more preferred between 10 nm and 50 nm, as the advantages according to the invention, in particular targeted voltage relief, become increasingly important with smaller recess widths. However, the advantages are also apparent for larger recess widths, in particular for recess widths below 500 nm, preferably below 400 nm, and even more preferably below 350 nm. The angle of incidence of the side walls of the recess is preferably between 90° and 30°, whereby at an angle of 90° the side wall of the recess is arranged vertically on the underlying layer. During structuring, the degree of rounding of the upper edge of the recess in the intermediate layer can be influenced by suitable selection of the processing parameters. This parameter can be used to influence the size and shape of the cavity in the gate structure according to the invention, wherein a cavity of maximum size can be achieved for a vanishing radius (i.e. no rounding of the edge area). With increasing rounding of the edge area, the size of the created cavity is reduced.

Optionally, a dielectric cladding can be deposited on the surface of the recess after creating the recess in the intermediate layer.

The recess is then filled and covered by depositing a Schottky metal by sputtering, wherein the covering is continued at least until the Schottky metal above the recess completely covers the recess. Sputtering is preferably carried out as magnetron sputtering, e.g. within an Ar environment (pressure range between 0.1 Pa and 5 Pa, power range between 0 W and 1000 W). The rotation speed of a substrate holder can preferably be between 0 rpm and 100 rpm. When using heat resistant Schottky metals, the load must be controlled to prevent detachment of the deposited metal.

During filling, the Schottky metal coats both the sides of the recess and the underlying layer (e.g. the active layer or an additional dielectric layer). Sputtering of the Schottky metal results in a reduced application of material to the bottom of the recess compared to the top of the recess. As the filling increases, this results in increased material growth on the upper side, wherein further growth of the metal layer inside the recess is increasingly suppressed. In particular, in the processing window mentioned above, the recess overgrowth occurs in the structure sizes typical for T-gates, wherein a cavity occurs in the interior of the Schottky metallization of the recess produced in this way in accordance with the invention. This cavity is produced by a lower lateral growth rate of the Schottky metal on the side walls of the recess through the coalescence of the Schottky metal above the recess. The process of forming the cavity is self-aligning.

Following the deposition of the Schottky metal, a contact element can be structured from the deposited Schottky metal, wherein the contact element lies directly on the intermediate layer, at least in sections. This structuring step largely corresponds to the corresponding steps for the generation of a conventional state-of-the-art self-aligning T-gate.

First, two layers of coating can be applied one above the other to the surface of the structures and structured in such a way that the lower coating layer above the recess in the intermediate layer has a larger opening than an opening structured at the same point in the upper coating layer. Preferably the coating openings have structure sizes between 50 nm and 1500 nm.

Preferably, the next step of the method according to the invention is the deposition of a gate metal covering the Schottky metal above the intermediate layer. The deposited gate metal can then be used as a self-aligning etching mask to remove excess Schotty metal in a suitable etching process. Such a procedure is particularly suitable for the formation of a T-Gate structure.

Preferably the contact element with the gate metal above the intermediate layer can then be completely surrounded by a dielectric covering layer. This can be done in particular by deposition of the dielectric coating.

BRIEF DESCRIPTION OF THE FIGURES

The invention is explained in the following examples using the corresponding figures. It is shown.

DETAILED DESCRIPTION OF THE FIGURES

Figure 1:
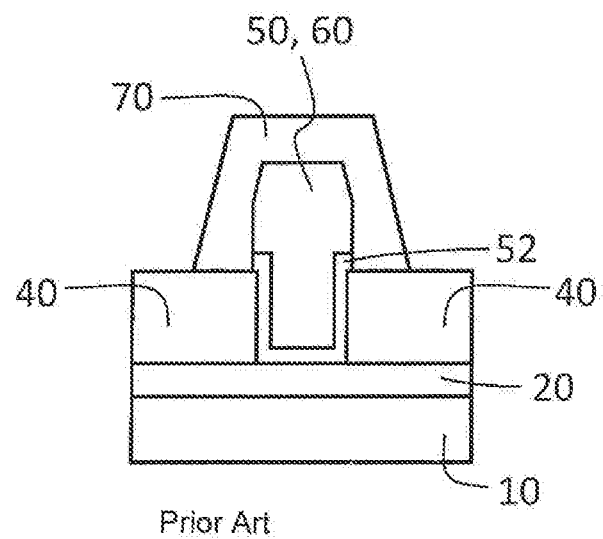
FIG. 1 a schematic structure of a conventional gate structure according to the state of the art, FIG. 2 a schematic structure of a first embodiment of the invention, FIG. 3 a schematic structure of a second embodiment of the invention, FIG. 4 a schematic structure of a third embodiment of the invention, FIG. 5 a schematic structure of a fourth embodiment of the invention, and FIG. 6 a schematic representation of the step "filling and covering" of the process according to the invention for producing a gate structure according to the invention.

FIG. 1 shows a schematic structure of a conventional gate structure according to the state of the art. In particular, it is a T-gate as typically used in a HEMT or MeSFET. The figure shows a gate structure comprising a substrate 10; an active layer 20 disposed on the substrate 10; an intermediate layer 40 disposed on the active layer 20, the intermediate layer 40 having a recess 45 extending through the entire intermediate layer 40 towards the active layer 20; and a contact element 50 disposed within the recess 45, wherein the contact element 50 completely and homogeneously fills the recess 45 and extends up to above the intermediate layer 40, wherein the contact element 50 rests at least in sections directly on the intermediate layer 40. The contact element here consists of a gate metal 60. The gate metal 60, for example, can be Au. The contact element 50 is separated from the active layer 20 and the intermediate layer 40 by a Schottky 52 metal cladding. The Schottky metal may in particular be a thin layer of Ir or Pt. The contact element 50 is completely surrounded by a dielectric covering layer 70 above the intermediate layer 40.

Figure 2:
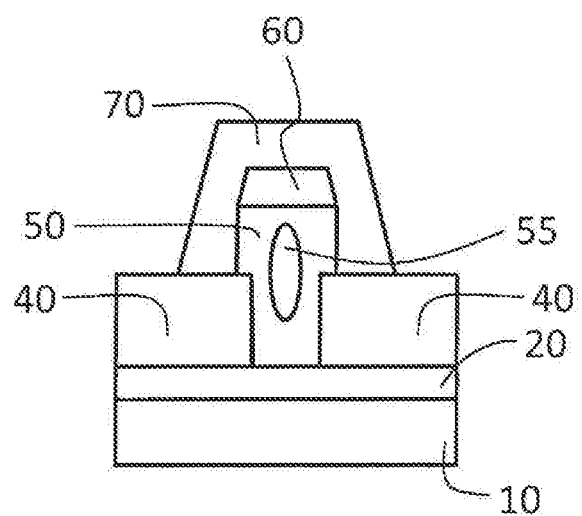

FIG. 2 shows the schematic structure of a first embodiment of the invention. This may also be, in particular, a T-gate for a HEMT or MeSFET. The figure shows a gate structure according to the invention comprising a substrate 10; an active layer 20 disposed on the substrate 10; an intermediate layer 40 disposed on the active layer 20, wherein the intermediate layer 40 has a recess 45 extending through the entire intermediate layer 40 towards the active layer 20; and a contact element 50, which is arranged within the recess 45, wherein the contact element 50 completely and homogeneously fills the recess 45 and extends up to above the intermediate layer 40, wherein the contact element 50 at least in sections rests directly on the intermediate layer 40; wherein the contact element 50 is constructed from a Schottky metal 52 and the contact element 50 has an interior cavity 55 completely enclosed by the Schottky metal 52. The contact element 50 contacts the active layer 20 directly. Furthermore, the contact element 50 above the intermediate layer 40 is directly covered by a gate metal 60 and the contact element 50 with the gate metal 60 is completely surrounded by a dielectric covering layer 70 above the intermediate layer 40.

Figure 3:
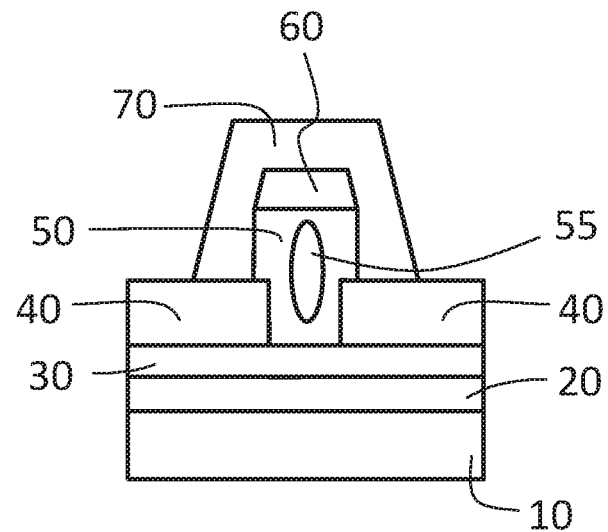

FIG. 3 shows a schematic structure of a second embodiment of the invention. In particular, this may be a T-gate of a MOSFET (variant 1). The representation shown corresponds as far as possible to the representation shown in FIG. 2, the reference signs and their assignment apply accordingly. However, unlike FIG. 2, the gate structure according to the invention comprises an additional dielectric layer 30 located directly between the active layer 20 and the intermediate layer 40, wherein the contact element 50 contacts the dielectric layer 30 directly.

Figure 4:
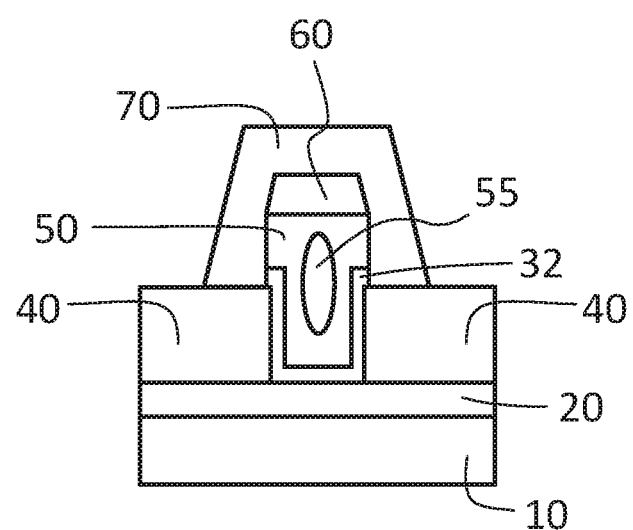

FIG. 4 shows a schematic structure of a third embodiment of the invention. In particular, this may be a T-gate of a MOSFET (variant 1). The representation shown corresponds as far as possible to the representation shown in FIG. 2, the reference signs and their assignment apply accordingly. In contrast to FIG. 2, the gate structure according to the invention shows that the contact element 50 is separated from the active layer 20 and the intermediate layer 40 by a dielectric cladding 32.

Figure 5:
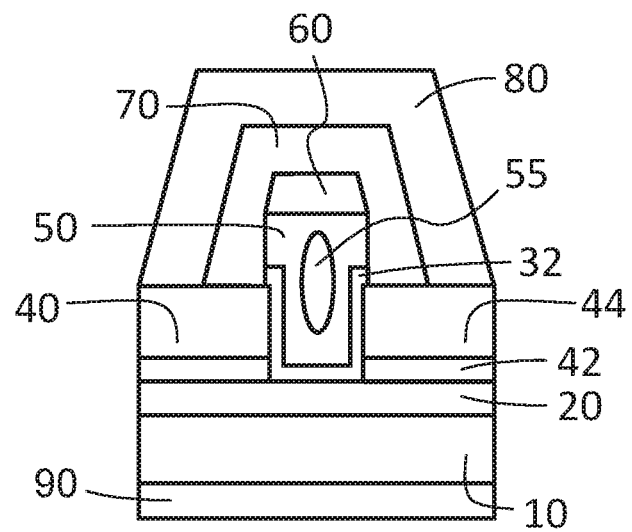

FIG. 5 shows a schematic structure of a fourth embodiment of the invention. In particular, this may be a T-gate of a MOSFET (variant 2). The representation shown corresponds as far as possible to the representation shown in FIG. 4, the reference signs and their assignment apply accordingly. In contrast to FIG. 4, the intermediate layer 40 is formed from a first intermediate layer 42 and a second intermediate layer 44. Furthermore, a source metal 80 has been applied above the dielectric covering layer 70. In the vertical transistor shown, a drain contact 90 is also located on the back of substrate 10. Preferably, substrate 10 is an n+-GaN substrate, active layer 20 is an n--GaN drift layer, first intermediate layer 42 is a p-type GaN layer, and second intermediate layer 44 is an n+-GaN layer.

Figure 6:
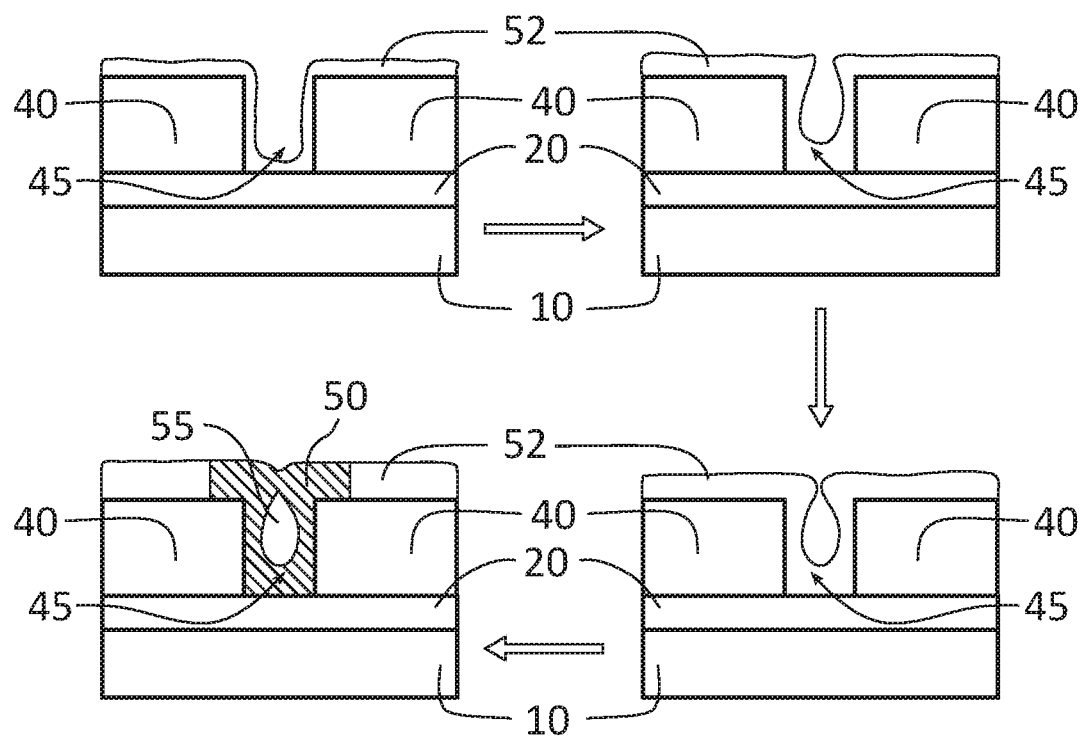

FIG. 6 shows a schematic representation of the step "filling and covering" of the method according to the invention for the production of a gate structure according to the invention. A substrate 10 having an active layer 20 disposed on the substrate 10 and an intermediate layer 40 disposed on the active layer 20 has been provided. Further, a recess 45 has been formed in the intermediate layer 40, wherein the recess 45 extends through the entire intermediate layer 40 towards the active layer 20. The filling and covering of the recess 45 is then performed by sputtering a Schottky metal 52, wherein the covering is continued at least until the Schottky metal 52 above the recess 45 completely covers the recess 45.

During filling, the Schottky metal 52 coats both the sides of the recess 45 and the underlying active layer 20 (or an additional dielectric layer 30). The sputtering of Schottky metal 52 results in a reduced application of material to the bottom of recess 45 compared to the top of recess 45. As the filling increases, this results in increased material growth on the top, with further growth of the metal layer inside recess 45 increasingly suppressed. In particular, the structure sizes typical for T-gates lead to an overgrowth of the recess 45, wherein a cavity 55 is created inside the Schottky metallization of the recess 45 produced in this way. This cavity 55 is produced by a lower lateral growth rate of the Schottky metal 52 on the side walls of recess 45 by the coalescence of the Schottky metal 52 above recess 45. The process of forming the cavity 55 is self-aligning.

In the last illustration step, the structuring of a contact element 50 made of the deposited Schottky metal 52 is merely indicated by hatching, wherein the contact element 50 lies directly on the intermediate layer 40 at least in sections. The T-shaped shape of the gate within the gate structure according to the invention is clearly visible.

REFERENCE LIST

10 substrate
20 active layer
30 dielectric layer
32 dielectric cladding
40 intermediate layer
42 first intermediate layer
44 second interlayer
45 recess
50 contact element
52 Schottky metal
55 cavity
60 gate metal
70 dielectric covering layer
80 source metal
90 drain contact

The invention claimed is:

1. A gate structure comprising:
a substrate;
an active layer disposed on the substrate;
an intermediate layer disposed on the active layer, wherein the intermediate layer has a recess extending through the entire intermediate layer towards the active layer;
a contact element which is arranged inside the recess, wherein the contact element completely fills the recess and extends to above the intermediate layer, wherein the contact element rests directly on the intermediate layer at least in sections or the contact element is separated from the active layer and the intermediate layer by a dielectric cladding,
wherein the contact element is made of a Schottky metal having an interior cavity completely enclosed by the Schottky metal; and
a dielectric layer disposed directly between the active layer and the intermediate layer, the contact element directly contacting the dielectric layer.

2. The gate structure of claim 1, wherein the intermediate layer is a passivation layer.

3. The gate structure of claim 1, wherein the intermediate layer comprises at least a first intermediate layer and a second intermediate layer.

4. A gate structure comprising:
a substrate;
an active layer disposed on the substrate;
an intermediate layer disposed on the active layer, wherein the intermediate layer has a recess extending through the entire intermediate layer towards the active layer, the intermediate layer is a passivation layer, the intermediate layer comprises at least a first intermediate layer and a second intermediate layer;
a contact element which is arranged inside the recess, wherein the contact element completely fills the recess and extends to above the intermediate layer, wherein the contact element rests directly on the intermediate layer at least in sections or the contact element is separated from the active layer and the intermediate layer by a dielectric cladding,
wherein the contact element is made of a Schottky metal having an interior cavity completely enclosed by the Schottky metal,
wherein the contact element contacts the active layer directly, and
wherein the contact element above the intermediate layer is directly covered by a gate metal and the contact element with the gate metal above the intermediate layer is completely surrounded by a dielectric covering layer; and
a dielectric layer disposed directly between the active layer and the intermediate layer, the contact element directly contacting the dielectric layer.

5. A gate structure comprising:
a substrate;
an active layer disposed on the substrate;
an intermediate layer disposed on the active layer, wherein the intermediate layer has a recess extending through the entire intermediate layer towards the active layer; and
a contact element which is arranged inside the recess, wherein the contact element completely fills the recess and extends to above the intermediate layer, wherein the contact element rests directly on the intermediate layer at least in sections or the contact element is separated from the active layer and the intermediate layer by a dielectric cladding,
wherein the contact element is made of a Schottky metal having an interior cavity completely enclosed by the Schottky metal, and
wherein the contact element above the intermediate layer is directly covered by a gate metal and the contact element with the gate metal above the intermediate layer is completely surrounded by a dielectric covering layer.

6. The gate structure of claim 5, wherein the contact element contacts the active layer directly.

7. The gate structure of claim 5, wherein the intermediate layer is a passivation layer.

8. The gate structure of claim 5, wherein the intermediate layer comprises at least a first intermediate layer and a second intermediate layer.

* * * * *